United States Patent
Kumesawa

(10) Patent No.: US 8,115,236 B2
(45) Date of Patent: Feb. 14, 2012

(54) SOLID STATE IMAGING DEVICE

(75) Inventor: Tetsuro Kumesawa, Tokyo (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 13/050,596

(22) Filed: Mar. 17, 2011

(65) Prior Publication Data

US 2011/0163361 A1    Jul. 7, 2011

Related U.S. Application Data

(63) Continuation of application No. 12/723,319, filed on Mar. 12, 2010, now Pat. No. 7,977,710, which is a continuation of application No. 11/243,910, filed on Oct. 4, 2005, now Pat. No. 7,709,863.

(30) Foreign Application Priority Data

Oct. 5, 2004 (JP) .................................. 2004-292873

(51) Int. Cl.
*H01L 27/148* (2006.01)
(52) U.S. Cl. ......... 257/223; 257/225; 257/229; 257/230
(58) Field of Classification Search .................. 257/223, 257/225, 229, 230
See application file for complete search history.

(56) References Cited

U.S. PATENT DOCUMENTS

| 3,953,733 | A | | 4/1976 | Levine | |
|---|---|---|---|---|---|
| 4,717,945 | A | * | 1/1988 | Yusa et al. | 257/229 |
| 5,122,850 | A | | 6/1992 | Burkey | |
| 5,410,349 | A | * | 4/1995 | Tanigawa et al. | 348/311 |
| 5,859,462 | A | | 1/1999 | Tredwell et al. | |
| 6,974,975 | B2 | * | 12/2005 | Shizukuishi | 257/98 |
| 2005/0212936 | A1 | | 9/2005 | Parks | |

FOREIGN PATENT DOCUMENTS

| JP | 54-051218 | 4/1979 |
|---|---|---|
| JP | 02-040956 | 2/1990 |
| JP | 09-065217 | 3/1997 |
| JP | 11-346331 | 12/1999 |
| JP | 2000-092395 | 3/2000 |
| JP | 2000-165749 | 6/2000 |

OTHER PUBLICATIONS

Decker et al., "A 256×256 CMOS Imaging Array with Wide Dynamic Range Pixels and Column-Parallel Digital Output," IEEE Journal of Solid-State Circuits, vol. 33, pp. 2081-2091, Dec. 1998.
Japanese Office Action issued on Oct. 6, 2009, for corresponding Japanese Patent Application JP 2004-292873.

* cited by examiner

*Primary Examiner* — Thinh T Nguyen
(74) *Attorney, Agent, or Firm* — K&L Gates LLP

(57) ABSTRACT

A solid state imaging device in which γ characteristic is obtained and enlargement of dynamic range is provided. The solid state imaging device includes a vertical overflow function and has a feature in which potential of a semiconductor substrate is changed from a high potential to a low potential in a stepwise manner during a period from an exposure start to an exposure end.

4 Claims, 7 Drawing Sheets

SOLID STATE IMAGING DEVICE

CROSS REFERENCES TO RELATED APPLICATIONS

The present application is a continuation of U.S. patent application Ser. No. 12/723,319 filed on Mar. 12, 2010, which is a continuation of U.S. patent application Ser. No. 11/243,910 filed on Oct. 4, 2005 and issued as U.S. Pat. No. 7,709,863, which claims priority to Japanese Patent Application No. 2004-292873 filed in the Japan Patent Office on Oct. 5, 2004, the entire contents of which being incorporated herein by reference.

BACKGROUND

The present disclosure relates to a solid state imaging device in which enlargement of dynamic range is made easy.

As for a solid state imaging device which is one of electronic devices, a CCD solid state imaging device (so-called CCD image sensor) which is a charge transfer type and a CMOS solid state imaging device (so-called CMOS image sensor) which reads out by addressing X-Y addresses are representative. Any one of these solid state imaging devices is similar in that incident light which enters into a photodiode arranged two-dimensionally is converted photo-electrically and one charge (for example, electron) thereof is made to be a signal charge.

In a camera using one of these solid state imaging devices of a CCD type or a CMOS type, amount of light is set to a standard setting level usually by using an aperture diaphragm of a lens or the like. For example, it can be said in a case when a landscape and clouds floating on the sky are to be taken a picture together or also, for example, in case of taking a picture indoors and in a case when an indoor ornament and a landscape on the outside of window are desired to be taken a picture together, but pictures actually taken by a camera would become very flat pictures without depth, because these solid state imaging devices possess saturation characteristic with respect to a strong light. Also, a request for high definition (for example, 2 million pixels) is strong for a recent solid state imaging device and miniaturization of the cell size thereof is being attained (for example, 3 micron angle), and an amount of maximum handling charge (Qs) is becoming smaller such that the number of electrons is becoming 6,000 to 10,000. Further, it has become a situation in which the setting level cannot be avoided from being raised in order to suppress an influence of a light shot noise in a standard setting state and an influence of a fixed pattern noise or a dark current and taken pictures are becoming pictures without depth all the more.

As means for solving these problems, a CCD solid state imaging device of a frame transfer system (see below patent reference 1) controls the amount of accumulated charge and recombines the overflow charge with the peripheral channel stop (in this case, without providing n-region), but actually a blooming phenomenon occurs in this frame transfer type.

In a CCD solid state imaging device of an inter transfer system (see below Patent Reference 2), a lateral overflow drain structure is employed and by controlling its overflow control electrode and further, in a CMOS solid state imaging device (see below non-patent reference 1), by controlling a reset voltage, Qs of each solid state imaging device is changed during the light acceptance and the relation between the amount of light and the output is made to possess γ characteristic for a conventional linear relation so as to pseudo-increase Qs.

On the other hand, in order to promote miniaturization pixel cell size, there is known a CCD solid state imaging device of a vertical overflow structure which executes sweeping out of a signal charge to the substrate side. In the CCD solid state imaging device of the vertical overflow structure, a constant substrate voltage is applied to the substrate during the light acceptance and it is constituted when an electronic shutter is carried out such that the substrate potential is changed so as to sweep out a signal charge to the substrate side (see below patent reference 3).

Also, γ correction is carried out by bending the linear curve of a TV signal process, but γ correction has not been employed in the vertical overflow structure.

[Patent Reference 1] U.S. Pat. No. 3,953,733 (RCA; 1975)
[Patent Reference 2] Jap. laid-open patent publication S54-51318
[Patent Reference 3] Jap. laid-open patent publication H2-40956
[Non-patent Reference 1] IEEE JSSC Vol. 33, PP2081 (MIT; December, 1998)

And now, also in the above mentioned solid state imaging device of the vertical overflow structure, enlargement of the dynamic range is attempted by applying γ characteristic to the relation between the amount of light and the amount of output charge, that is, enlargement of the dynamic range is attempted, because it is desired to pretend such that the amount of accumulated charge around 3 micron angle at the present situation can be seen to be large even if it is a pseudo-operation.

SUMMARY

In view of the above mentioned aspects, the present disclosure relates to a solid state imaging device in which enlargement of the dynamic range is attempted by obtaining a γ characteristic.

The solid state imaging device in an embodiment has a vertical overflow function and has a feature in which potential of a semiconductor substrate is changed from a high potential to a low potential in stepwise manner during a period from an exposure start to an exposure end.

It is preferable in the stepwise change of aforesaid semiconductor substrate potential to control the amount of saturation current so as to become larger in a stepwise manner. It is preferable for the aforesaid semiconductor substrate potential to be controlled in a horizontal blanking period.

In the solid state imaging device in an embodiment, the potential barrier of the overflow controlling gate region is modulated in a direction in which it becomes high in a stepwise manner by changing the potential of the semiconductor substrate from high potential to a low potential in a stepwise manner when receiving light and it is possible to control the amount of saturation current, that is, the amount of maximum handling charge for time direction.

It is possible to apply γ characteristic to the relation between the amount of light and the amount of output charge by changing the saturation current amount to become larger in a stepwise manner depending on the stepwise change of the substrate potential.

It is possible to suppress a noise caused by a change over of the substrate potential by controlling (so-called changing over) the substrate potential in a horizontal blanking period.

According to the solid state imaging device in an embodiment, it is possible in a solid state imaging device having a vertical overflow function to control the amount of saturation current in time direction by changing the potential of the semiconductor substrate from a high potential to a low potential in a stepwise manner after the exposure start of the solid state imaging device until the exposure end thereof, so that it is possible to attempt enlargement of the dynamic range.

By controlling the amount of saturation current to become larger in a stepwise manner depending on the stepwise change of the substrate potential, it is possible to apply nonlinearity, that is, γ characteristic to the amount of light-the amount of output charge of the solid state imaging device and to attempt enlargement of the dynamic range. Also, by controlling the substrate potential in a horizontal blanking period, it is possible to prevent a noise which might occur on a picture screen when the substrate potential is changed over.

Additional features and advantages are described herein, and will be apparent from, the following Detailed Description and the figures.

DETAILED DESCRIPTION

Hereinafter, exemplified embodiments will be explained with reference to the drawings.

Figure 1:
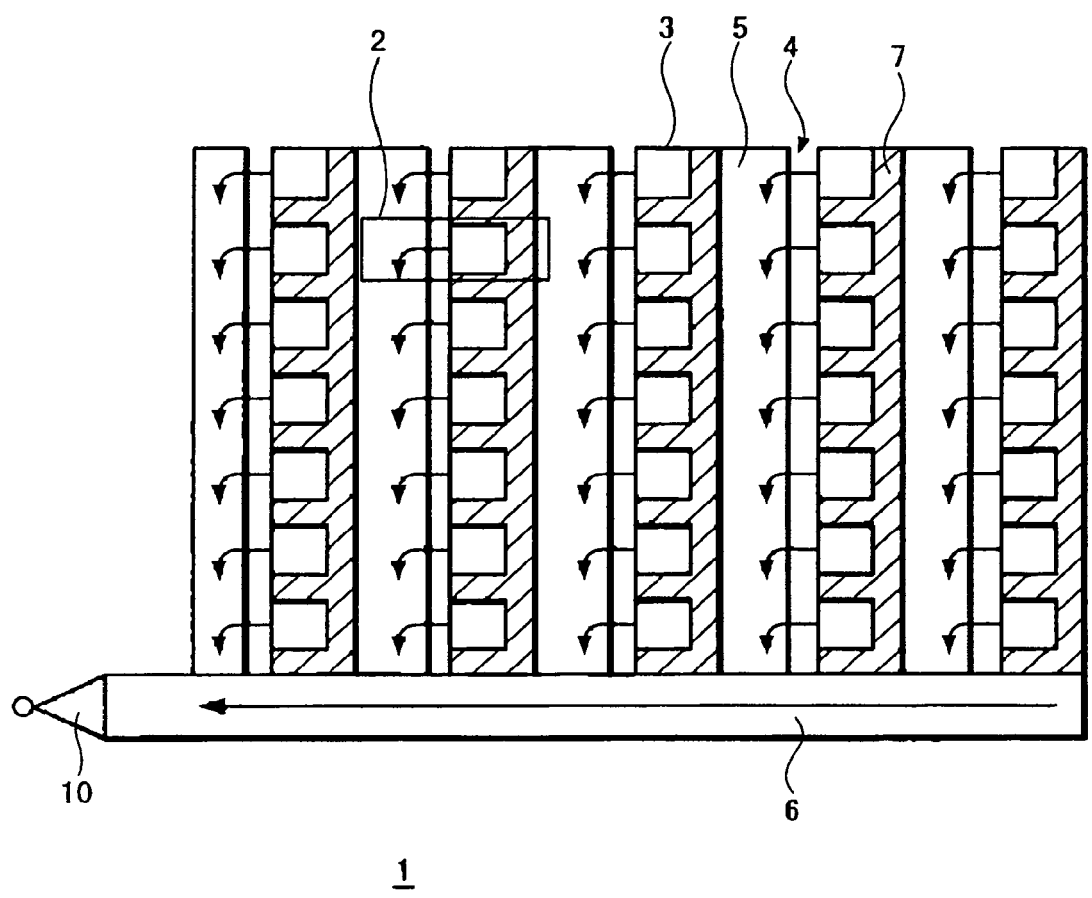
FIG. 1 is an outline of a constitutional diagram showing one exemplified embodiment of a solid state imaging device.

FIG. 1 is a constitutional diagram showing one exemplified embodiment of a solid state imaging device. It will be explained as one example by using a CCD solid state imaging device of a vertical overflow drain (OFD: Overflow Drain) constitution.

A CCD solid state imaging device 1 of the vertical OFD constitution relating to this exemplified embodiment is composed by including a light receiving portion which becomes pixels constituted as an interline transfer system, that is, a photosensor portion 3; a reading out portion (so-called reading out gate portion) 4 for reading out a signal charge from the photosensor portion 3; a vertical charge transfer portion (so-called vertical transfer register portion) 5 of a CCD constitution which transfers a signal charge read out by the reading out portion 4 to a vertical direction; and a horizontal charge transfer portion (so-called horizontal transfer register portion) 6 which sequentially transfers an electric charge transferred by the vertical charge transfer portion 5 to an output circuit 10 in every horizontal line. Each photosensor portion 3 is separated by a pixel separation portion 7.

Figure 2:
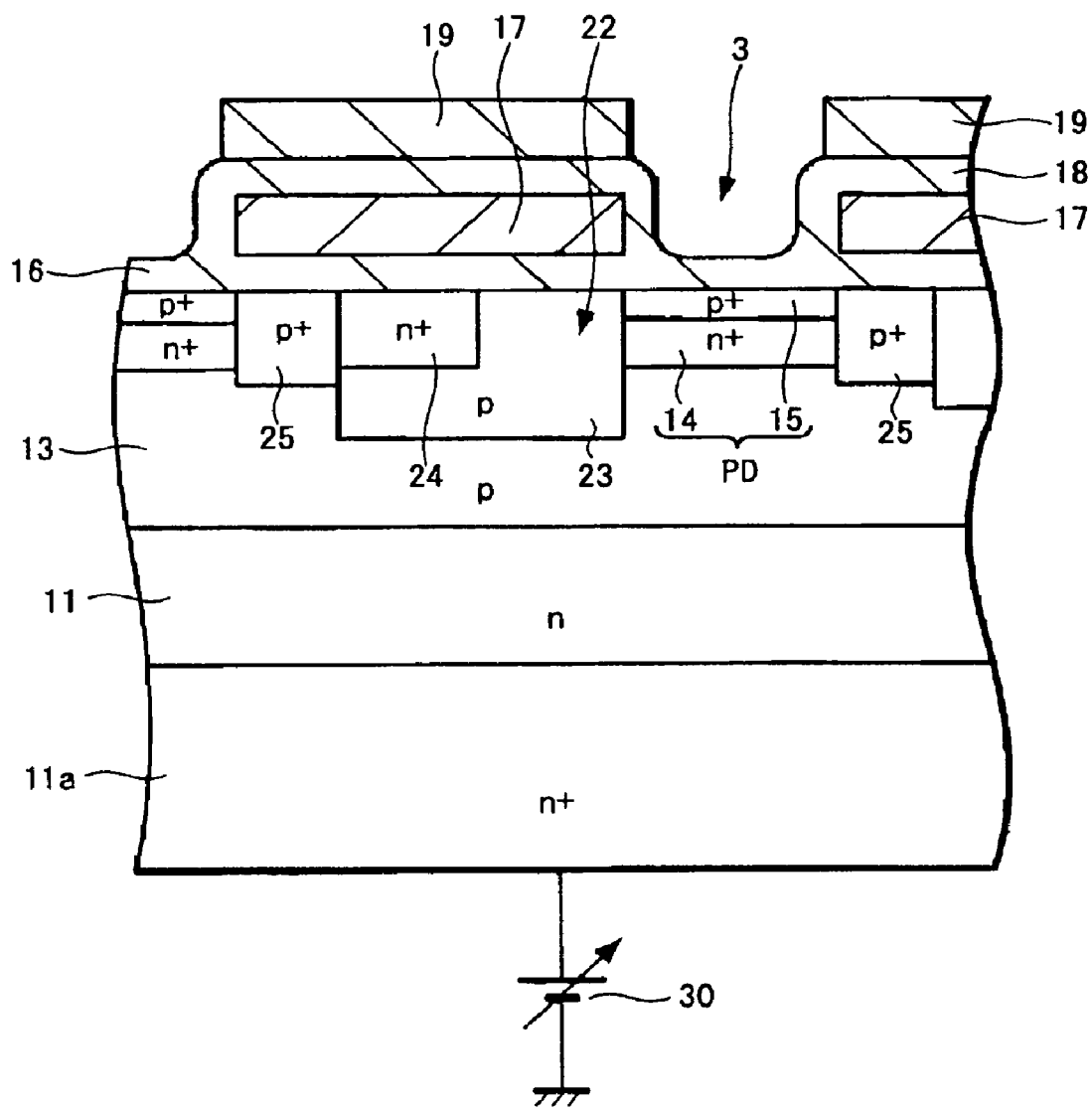
FIG. 2 is a cross sectional diagram showing one exemplified embodiment of a CCD type solid state imaging device.

In FIG. 2, a cross sectional structure of a unit pixel is shown.

The CCD type solid state imaging device relating to this exemplified embodiment is composed such that a second conductivity type, that is, a p-type first well region 13 on a semiconductor substrate (Hereinafter, designated as substrate) 11 of a first conductivity type which is an n-type according to this example is formed and in the p-type first well region 13, a photosensor portion 3 formed by an n-type semiconductor region 14 and a p-type charge accumulation region (so-called p+ Accumulation region) 15 on the surface thereof, in other words, a photodiode PD is arranged in a matrix fashion and each pixel of each photosensor portion 3 is formed therein.

Also, in the p-type first well region 13, a p-type second well region 23 is formed apart from the photodiode 14 arranged on each vertical line by a necessary distance, an n-type charge transfer region (so-called transfer channel region) 24 is formed on the p-type second well region 23 and further, a vertical transfer electrode 17 is formed thereon through a gate insulation film 16 made by, for example, SiO2 or the like so as to constitute the vertical charge transfer portion 5.

A p-type reading out region 22 of a signal charge is formed between the vertical charge transfer portion 5 and the corresponding photodiode 14 and the reading out portion 4 is constituted. The pixel separation portion 7 by a p-type pixel separation region (so-called channel stop region) 25 is formed between adjacent and different vertical transfer portions. A unit pixel cell 2 is constituted by one photosensor portion 3, reading out portion 4, a vertical charge transfer portion 5 and a pixel separation portion 7.

The vertical transfer electrode 17 is formed, for example, by polycrystal silicon and at the same time, is formed extending from the pixel separation region 5 to the reading out region 22. Further, a light shielding layer 19 is formed on the whole area including the top of the vertical transfer electrode 17 through an interlayer insulation film 18 of SiO2 or the like. Then, an opening 26 is formed on the photosensor portion 3 of the light shielding layer 19, light receiving is carried out by the photosensor portion 3 through these openings 26 and a signal charge is generate by the photodiode 14 in response to the amount of receiving light.

An n-type high impurity concentration region 11a is formed on the rear surface side of an n-type substrate 12 in order to make it to have a low resistance. The photosensor portion 3 of this example constitutes an HAD (Hole Accumulated Diode) sensor by an npnp structure of a p+ accumulation region 15, the n-type semiconductor region 14, the p-type first well region 13 and the n-type substrate 11.

Then, the p-type first well region 13 becomes an overflow controlling gate region and the n-type substrate 11 becomes an overflow drain region so that a CCD solid state imaging device of a vertical overflow structure is constituted. More specifically, a necessary substrate voltage Vsub is applied to the substrate 11 and charge overflowed from the photosensor portion 3 is take out to the substrate 11 side.

In this CCD solid state imaging device, signal charge converted photo-electrically and accumulated by the photosensor portion 3 is read out to each corresponding vertical charge transfer portion 5 through the reading out portion 4, is transferred in the vertical charge transfer portion 5, is transferred to the horizontal charge transfer portion 6 in every horizontal line and further, is transferred in the horizontal charge transfer portion 6 in one direction so as to be voltage-converted and outputted through the output circuit 10. During the light receiving period, charge overflowed from the photosensor portion 3 is swept out from the n-type substrate 11 applied with the substrate voltage Vsub through the p-type first well region 13 which is an overflow control region. On the other hand, with respect to the electronic shutter, all the charge during the electronic shutter period is swept out to the n-type substrate 11 by making the substrate voltage Vsub to be a substrate voltage Vsub+ΔV higher than a substrate voltage Vsub during the light receiving period.

Then, in the vertical overflow structure according to this exemplified embodiment, a substrate voltage valuable control means 30 is particularly provided for change-controlling the substrate voltage Vsub applied to the n-type substrate 11 from a high potential to a low potential in a stepwise manner during the light receiving period, that is, the period from the exposure start to the exposure end. It is constituted by this substrate voltage valuable control means 30 such that the height of the potential barrier of the p-type first well region 13 which is an overflow control gate region in the light receiving period is modulated from a low state to a high state in a stepwise manner and the amount of maximum handling electrical charge in the photosensor portion 3 is to be increased in a stepwise manner.

It will be described in more detail with respect to such exemplified embodiments.

The solid state imaging device of the vertical overflow structure has a structure devised intrinsically for the purpose of lowering the shutter voltage. More specifically, to be able to lower the shutter voltage means that the control of the amount of charge accumulated in the sensor portion can be easily accomplished with respect to the substrate voltage Vsub.

Here, when taking the CCD solid state imaging device 1 having a constitution of the n-type substrate 11 and the p-type well region 13 as an example, the handling amount of charge (hereinafter, referred to as amount of accumulated charge) Qs=500 mV is supposed for the solid state imaging device 1, the substrate voltage (hereinafter, referred to as Vsub voltage) Vsub=7V is supposed for the substrate board 11 and Vsub=12V (Qs=0) is approximately supposed on an occasion of a shutter, so that assuming that it is linear during that period, $\Delta Qs/\Delta Vsub = 100$ mV is supposed, more specifically, it becomes possible to change the Handling amount of charge Qs by 100 mV when changing the Vsub voltage by 1V.

Figure 3:
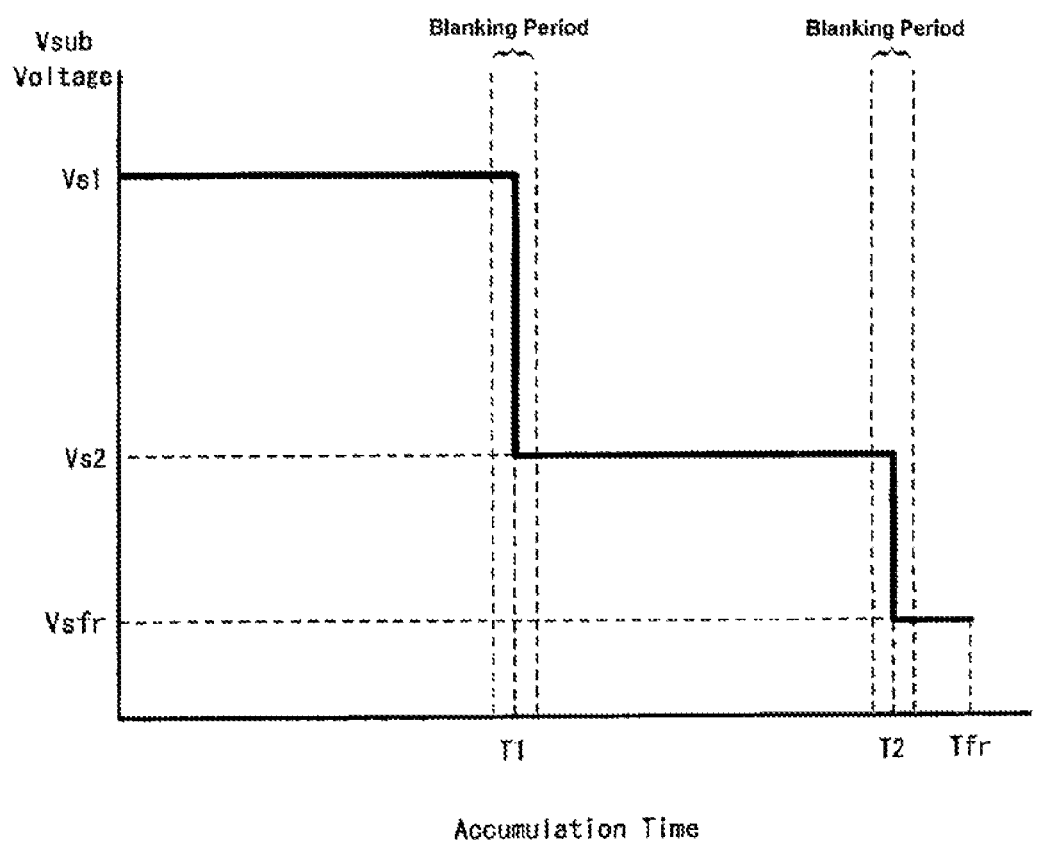
FIG. 3 is a graph showing a relation between a Vsub voltage of a substrate board and an accumulation time T.
Figure 4:
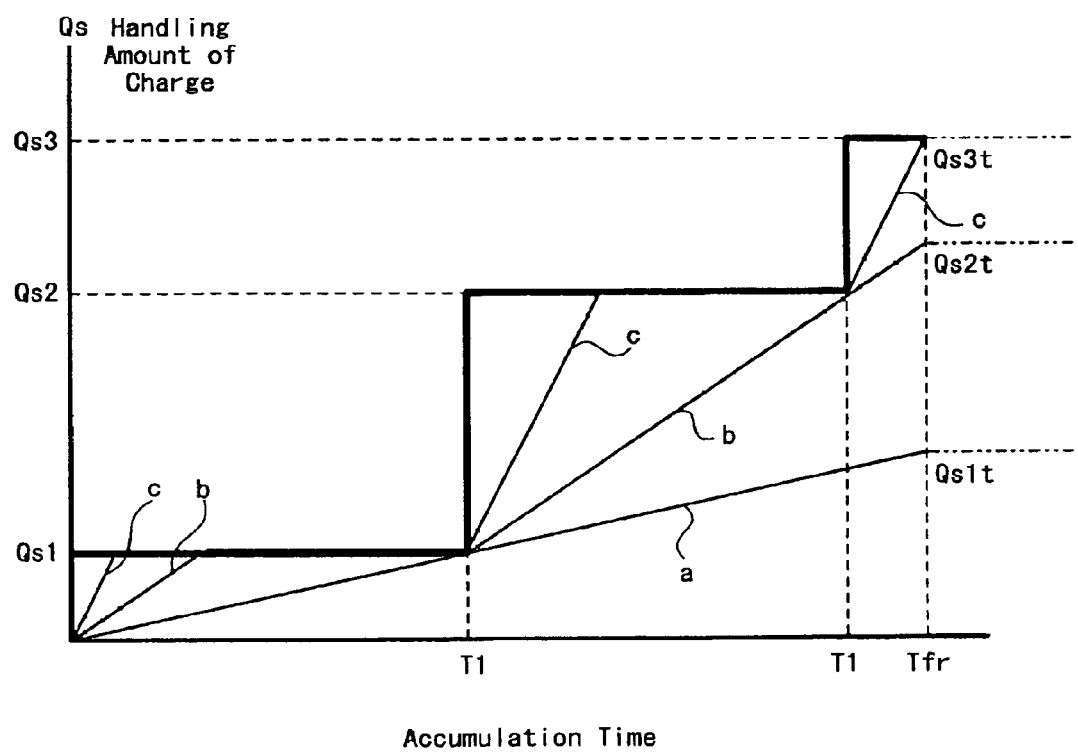
FIG. 4 is a graph showing a relation between a handling amount of charge Qs and an accumulation time T.

Next, it will be considered as shown in FIG. 3 about a case in which the Vsub voltage of the CCD solid state imaging device is made to change in three steps of, for example, Vs1, Vs2 and Vsfr during one frame period Tfr. The time for changing the substrate voltage Vsub is T1 and T2 and usually, Vsub value=Vsfr is established in which the Vsub value shows the amount of accumulated charge Qs (usual value Qs3 of CCD solid state imaging device) during the period from a time point T2 until a time point Tfr. Also, it is desirable for the change-over point of the substrate voltage Vsub value to be set in a horizontal blanking period in order to prevent noises on an occasion of the change over. Supposing that the substrate voltage Vsub value from the accumulation time start to the accumulation time T1 is Vs1 and further supposing that the substrate voltage Vsub value from the time point T1 to the time point T2, the amount of accumulated charge Qs of the CCD solid state imaging device also changes to Qs1, Qs2 and Qs3 as shown in FIG. 4 in accordance with the elapse of the accumulation time. Here, it will be considered about various amounts of light which enter into the solid state imaging device in a case when a photogenic subject is stationary during one frame. Assuming that it is stationary during one frame, the various amounts of light become in proportion to the accumulation time and it can be considered that the stronger the amount of light is, the larger the inclination is. Also, as largeness of the amount of light is in proportion to the generated amount of charge, it can be considered that the amount of light is equal to the strength of the charge generation. In FIG. 4, amounts of light having three kinds of strength, that is, a, b and c are taken into account. First, the amount of light a becomes the amount of accumulated charge Qst1 after the time Tfr, because no limitation of the amount of charge is applied thereto. Next, the amount of light b reaches a saturation point of the amount of accumulated charge Qs1 before the time T1 elapses (passing through a dead zone) and thereafter, it reaches until the amount of accumulated charge Qs2t without receiving the Qs change after the time T1 until the time Tfr. Further, the amount of light c reaches the saturation point Qs1 before the elapse of the time T1 and reaches the saturation point Qs2 before the elapse of the time T2 after the time T1 such that it is an amount of light which just reaches the point of the amount of maximum handling electrical charge Qs3 when time Tfr elapsed.

Figure 5:
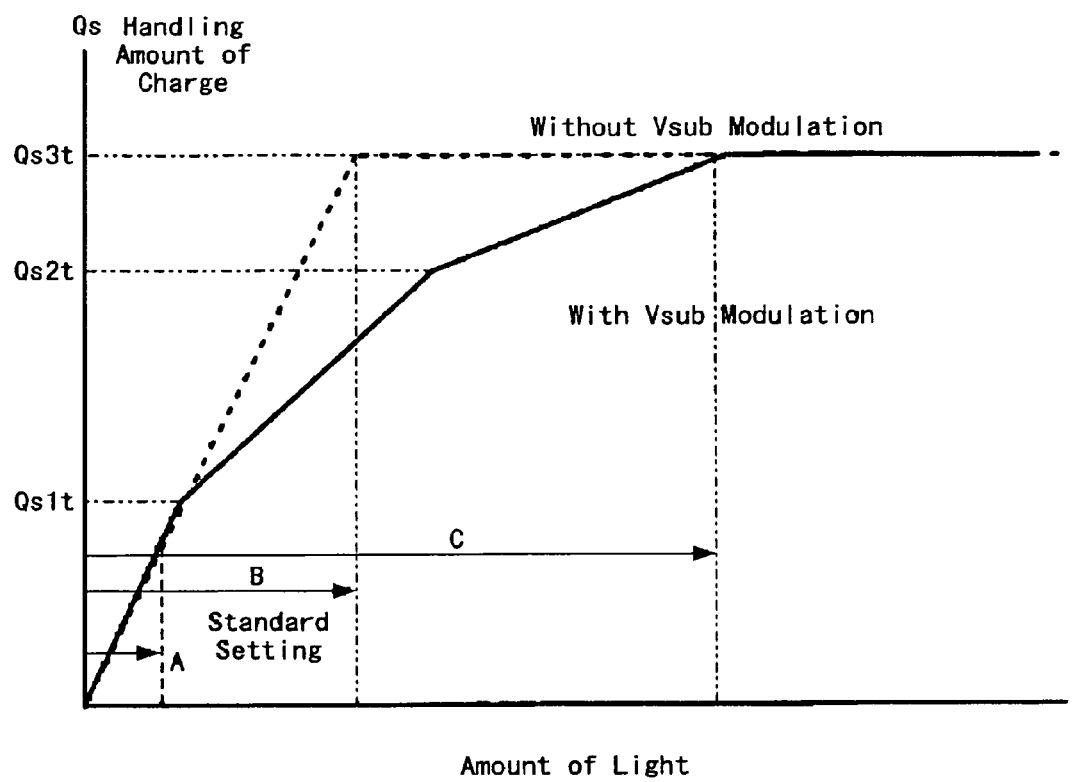
FIG. 5 is a graph showing a relation between a handling amount of charge Qs and amount of light.

When it is considered like this, it is possible as shown in FIG. 5 to draw a graph of the amount of light and the handling amount of charge with respect to the respective amounts of light a, b and c divided by occasions when it is from the amount of light zero to g the amount of light a, it is from the amount of light a to the amount of light b and it is larger than the amount of light c.

The dotted line (see FIG. 5) is characteristic of the amount of light and the amount of accumulated charge Qs in a usual operation when a limitation time period of Qs is not provided in the accumulation time just like this explanation example and the modulation of the Vsub voltage was not carried out.

With respect to this characteristic, the solid state imaging device of this exemplified embodiment can realize γ characteristic (nonlinearity is applied to amount of light-amount of accumulated charge) which the characteristic of the solid line shows by modulating the substrate voltage Vsub in the horizontal blanking period, that is, by controlling the substrate voltage Vsub of the substrate in a stepwise manner so as to be set to a high potential Vs1 corresponding to the amount of accumulated charge Qs1t, to the mid potential Vs2 corresponding to the amount of accumulated charge Qs2t and further to the low potential Vs3 corresponding to the amount of accumulated charge Qs3t. Also, when, for example, A point is selected as a standard setting level, it is recognized with respect to the dynamic range until the amount of saturation current that it becomes six times as much or more (see C) in the solid state imaging device shown in this exemplified embodiment while it was three times as much (see B) in a usual usage state.

Figure 6:
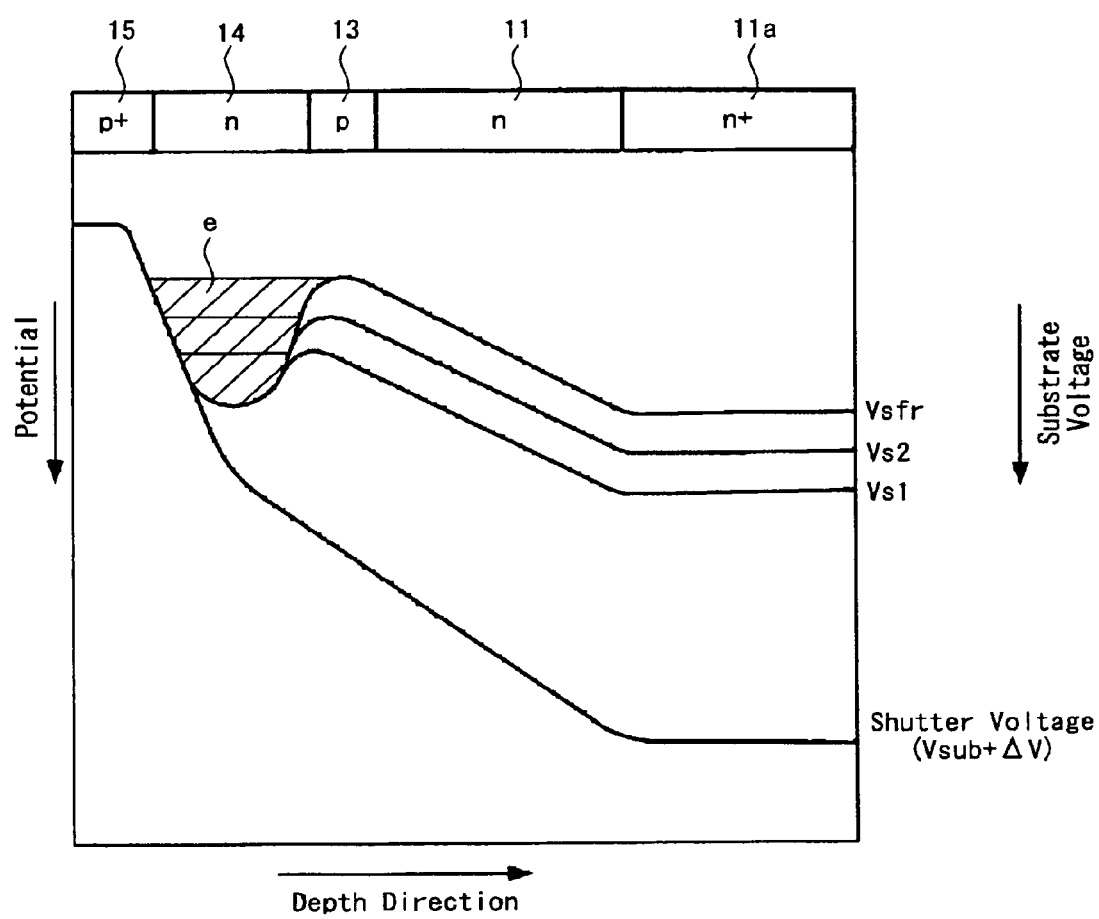
FIG. 6 is a potential distribution diagram showing a change of overflow barrier and a change of a handling amount of charge to be used for the explanation of the present embodiment.

FIG. 6 shows height change of the potential barrier of the p-type first well region 13 and amount change of handling charge in the light receiving portion 3 when the substrate voltage Vsub is changed.

Next, there will be shown one example of impurity concentration of each region in the CCD type solid state imaging device 1 relating to this exemplified embodiment shown in FIG. 1.

Impurity concentration of the n-type substrate 11 is made to be $10^{15}$ cm$^{-3}$ order, for example, to be $0.2^X 10^{15}$ cm$^{-3}$ or more and $5.0^X 10^{15}$ cm$^{-3}$ or less. Impurity concentration of the n+ substrate 11a is made to be $10^{17}$ cm$^{-3}$ order, for example, to be $1^X 10^{17}$ cm$^{-3}$ or more and $1^X 10^{18}$ cm$^{-3}$ or less. Impurity concentration of the p-type first well region 13 which becomes an overflow control region is made to be $10^{15}$ cm$^{-3}$ order, for example, to be $0.2^X 10^{15}$ cm$^{-3}$ or more and $2.0^X 10^{15}$ cm$^{-3}$ or less. Impurity concentration of the n-type semiconductor region 14 which becomes a light receiving portion is made to be $10^{16}$ cm$^{-3}$ order, for example, to be $0.2^X 10^{16}$ cm$^{-3}$ or more and $2.0^X 10^{16}$ cm$^{-3}$ or less. Impurity concentration of the p++ region 15 which becomes accumulation is made to be $10^{18}$ cm$^{-3}$ order, for example, to be $0.2^X 10^{18}$ cm$^{-3}$ or more and $6.0^X 10^{18}$ cm$^{-3}$ or less. Impurity concentration of the n-type buried channel 24 is made to be $10^{17}$ cm$^{-3}$ order, for example, to be $0.2^X 10^{17}$ cm$^{-3}$ or more and $2.0^X 10^{17}$ cm$^{-3}$ or less.

Impurity concentration of the p-type second well region 23 which has a constitution such as surrounding the n-type buried channel 24 is made to be $10^{16}$ cm$^{-3}$ order, for example, to be $0.2^X 10^{16}$ cm$^{-3}$ or more and $5.0^X 10^{16}$ cm$^{-3}$ or less.

According to the CCD type solid state imaging device 1 relating to the present embodiment, it is possible in a structure having a vertical overflow function to increase the amount of light with respect to the amount of maximum accumulated charge Qs as compared with that of a conventional structure by controlling the substrate voltage Vsub of the substrate 11 from a high voltage to a low voltage in a stepwise manner during the light acceptance by means of the substrate voltage valuable control means 30, by changing the potential barrier height of the first p-type well region 13 which is an overflow controlling gate region, by carrying out modulation of the amount of accumulated charge Qs and by obtaining γ characteristic as mentioned above, so that it is possible to enlarge the dynamic range.

Figure 7:
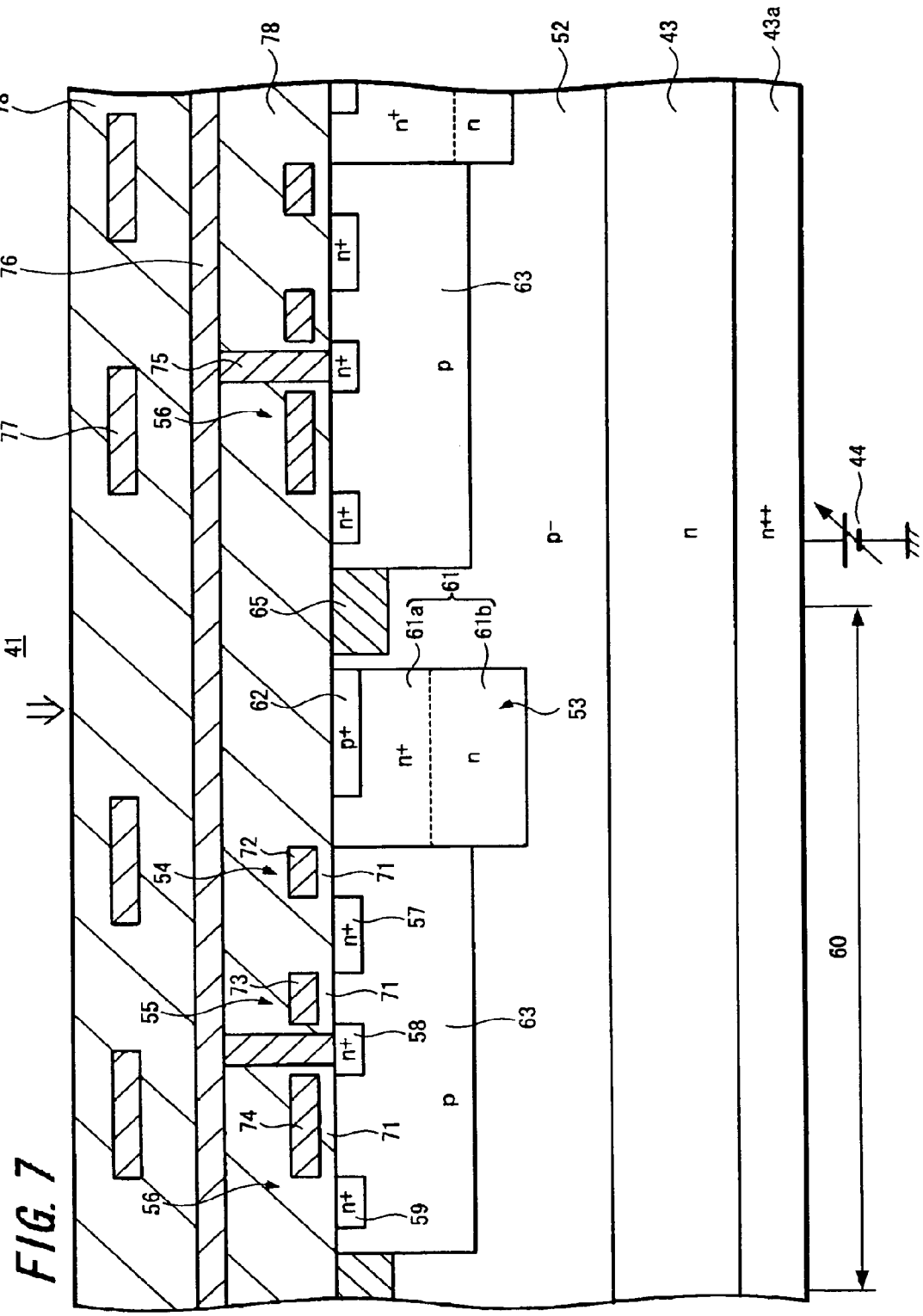
FIG. 7 is a cross sectional diagram showing another exemplified embodiment of a CMOS type solid state imaging device.

FIG. 7 shows another exemplified embodiment in a case when the solid state imaging device is applied to a CMOS solid state imaging device and the noticed drawing is particularly is a cross sectional diagram showing a main peripheral portion of a light receiving portion.

With respect to a CMOS type solid state imaging device 41 relating to this exemplified embodiment, for example, a first well region 52 of p-type which is a second conductivity type is formed on a substrate 43 of a first conductivity type, that is, n-type in this example which includes a high impurity concentration region 43a on its rear surface side, a pixel separation region 65 for separating each pixel is formed on the surface side of the first p-type well region 52, and a photodiode 53 and a plurality of MOS transistors formed in a second p-type well region 63, that is, four MOS transistors of an electric charge readout transistor 54, a reset transistor 55, an amplifying transistor 56 and a vertical selection transistor (not shown) are formed on each separated region and thereby a unit pixel 60 is constructed. Then, a large number of pixels 60 are arrayed in a two-dimensional matrix fashion.

The photodiode 53 is composed of a second conductivity type, that is, an n type semiconductor region 61 [n+ regions 61a, 61b] formed from the surface of the p type first well region 52 with a predetermined depth by ion implantation and a p type semiconductor region (p++ region) 62 with a high impurity concentration formed on the surface of the n type semiconductor region 61.

Each of MOS transistors 54, 55 and 56 is constructed as follows. On the surface of the p type semiconductor substrate 52, there are formed n-type semiconductor regions with a high impurity concentration surrounded by the p-type second well region 63, that is, n+ source-drain regions 57, 58 and 59 by ion implantation so as to adjoin the photodiode 53.

The electric charge readout transistor 54 is composed of an n+ source-drain region 57, an n+ region 61a with a high impurity concentration on the surface side of the photodiode 53 and a gate electrode 72 formed on the p-type first well region 52 between the two regions 57 and 61a through a gate insulating film 71.

The reset transistor 55 is composed of n+ source-drain regions 57 and 58 and a gate electrode 73 formed on the p-type first well region 52 between the two regions 57 and 58 through the gate insulating film 71. The n+ source-drain region 57 is what might be called a floating diffusion (FD) region.

The amplifying transistor 56 is composed of n type source-drain regions 58 and 59 and a gate electrode 74 formed on the two regions 58 and 59 through the gate insulating film 71.

Although not shown, in a similar manner, the vertical selection transistor is comprised of a pair of source-drain regions and a gate electrode formed on the p-type first well region 52 between the two regions through a gate insulating film.

With respect to circuit interconnections of the above-mentioned respective MOS transistors, the explanation thereof will be omitted. Here, the n type source-drain region 58 for connecting the reset transistor 55 and the amplifying transistor 56 of each pixel is connected to a power supply interconnection 76 through a connector conductor 75. Further, a multilayer interconnection 77 including the power supply interconnection 76 is formed on the p-type first well region 52 through an interlayer insulator 78.

In the CMOS solid state imaging device 41 of this exemplified embodiment, the first p-type well region 52 is made to be an overflow controlling gate region and the substrate voltage Vsub is applied to the n-type substrate 43 so as to form a vertical overflow structure. Then, it is constituted in the CMOS solid state imaging device 41 such that substrate voltage valuable control means 44 is connected thereto for controlling the substrate voltage Vsub variably from a high voltage to a low voltage in a stepwise manner during the light acceptance in order to control the amount of saturation current similarly as mentioned above. The method of modulating the substrate potential is similar as that of the case of the above-mentioned CCD solid state imaging device, so that a repetitive explanation will be omitted.

The CMOS solid state imaging device 41 is constituted as a surface irradiation type in which light enters into the photodiode 53 from the surface side of multi-layer wirings 77 and a signal charge corresponding to the amount of receiving light is accumulated by photoelectric-converted in the photodiode 53.

It should be noted in the CMOS solid state imaging device 41 that it is possible to make the impurity concentrations of the substrate 43, the high impurity region 43a and the first p-type well region 52 which becomes an overflow controlling gate region similarly to be similar concentrations as the corresponding regions in the CCD solid state imaging device 1 mentioned above. However, the impurity concentration of the n-type region 24 which becomes a floating diffusion FD is made to be $10^{19}$ cm$^{-3}$ order.

According to the CMOS solid state imaging device 41 relating to this exemplified embodiment, a vertical overflow structure including the n-type substrate 43 and the first p-type well region 52 is formed and by changing the substrate potential Vsub of the n-type substrate 43 from a high potential to a low potential in a stepwise manner during the light acceptance by means of the substrate voltage valuable control means 44, it is possible to prolong the accumulation time until the amount of saturation charge as compared with a conventional way and to make the amount of light with respect to the amount of accumulated charge Qs more than that of a conventional structure, so that it is possible to enlarge the dynamic range. It should be noted in the CMOS solid state imaging device 41 of this exemplified embodiment that it is also possible to get an electronic shutter function by setting the substrate voltage Vsub to a necessary high voltage.

As mentioned above, according to the solid state imaging device relating to the present embodiment, it is possible to make the amount of light with respect to the amount of accumulated charge Qs more than that of conventional structure in a vertical overflow function including an n-type substrate and a p-type well region by carrying out modulation of the amount of accumulated charge Qs by controlling the substrate voltage Vsub of the substrate during the light acceptance by means of the substrate voltage valuable control means so as to obtain the γ characteristic as mentioned above, so that it is possible to enlarge the dynamic range. Also, noise influence to the picture can be suppressed by putting the control (changeover) point of the Vsub voltage in the horizontal blanking period.

It is possible to employ this structure in another solid state imaging device other than the solid state imaging devices of these exemplified embodiments mentioned above.

It should be understood by those skilled in the art that various modifications, combinations, sub-combinations and alterations may occur depending on design requirements and other factors insofar as they are within the scope of the appended claims or the equivalents thereof.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A solid state imaging device having a vertical overflow function, the solid state imaging device comprising:
   a photodiode for receiving an incident light on a semiconductor substrate, the photodiode being a CMOS sensor; and
   a transfer gate for transferring charge accumulated in the photodiode;
   wherein a potential of the semiconductor substrate is changed from a high potential to a low potential during acceptance of the incident light by providing a voltage to an electrode different from the transfer gate.

2. A solid state imaging device according to claim 1, wherein a relationship between an amount of incident light and an amount of accumulated charge in the imaging device is nonlinear.

3. A solid state imaging device according to claim 1, wherein an amount of a saturation current in the imaging device is controlled so as to become larger in a stepwise manner depending on the change of the semiconductor substrate potential.

4. A solid state imaging device according to claim 1, wherein the semiconductor substrate potential is changed during a horizontal blanking period.

* * * * *